United States Patent [19]

Kane

[11] Patent Number: 4,524,127
[45] Date of Patent: Jun. 18, 1985

[54] METHOD OF FABRICATING A SILICON LENS ARRAY

[75] Inventor: James Kane, Lawrenceville, N.J.

[73] Assignee: RCA Corporation, Princeton, N.J.

[21] Appl. No.: 489,222

[22] Filed: Apr. 27, 1983

[51] Int. Cl.³ .................... G03C 5/00; G03B 21/60
[52] U.S. Cl. ................................ 430/321; 430/320; 430/323; 430/946; 350/128; 350/167; 354/101; 156/647; 156/662
[58] Field of Search ............... 430/320, 323, 324, 6, 430/7, 946, 396, 321, 317, 321; 350/128, 167; 156/636, 651, 659.1, 662, 647; 354/101; 252/79.4

[56] References Cited

PUBLICATIONS

Burdick et al., IBM Technical Disclosure Bulletin, vol. 23, No. 9, Feb. 1981, p. 4144.
Tsang et al., J. of Applied Physics, vol. 46, No. 5, May 1975, pp. 2163-2166.
Bassous et al., J. Electrochem. Soc.: Solid-State Science and Technology, vol. 125, No. 8, Aug. 1978, pp. 1321-1327.

Primary Examiner—John E. Kittle
Assistant Examiner—José G. Dees
Attorney, Agent, or Firm—Birgit E. Morris

[57] ABSTRACT

A lenticular array in silicon is made by anisotropically etching a V-shaped groove in a 100 silicon wafer wherein the walls of the V are made by intersecting 111 planes and exposing the surface having the V-grooves therein to a polishing etch whereby a series of lenses is formed between the V-grooves.

8 Claims, 9 Drawing Figures

WITHOUT LENTICULAR ARRAY

LENTICULAR ARRAY AT THE PRIME FOCUS

METHOD OF FABRICATING A SILICON LENS ARRAY

This invention relates to a process for making a lens array in silicon useful for Schottky charge-coupled device infrared sensor arrays.

BACKGROUND OF THE INVENTION

Schottky charge-coupled device infrared sensor arrays are known. The sensor arrays are fabricated in silicon, but only about 20–30% of the area of the silicon crystal is infrared-sensitive. Thus it would give a great increase in sensitivity of the sensor array if incoming light could be focused onto the infrared-sensitive portions of the array. Since the sensor areas are generally longer in one direction than in the other, a cylindrical lens array would greatly increase the sensitivity of the sensor device.

However, the fabrication of such a lens array has many problems. The lens material must be transparent to infrared light, i.e., light of 3–5 micron wavelength; it must be of high quality in terms of lens profile uniformity and smoothness to achieve a uniform focal plane with a minimum of random scattered light; it must be cost effective; and, since the sensor array must operate at very low temperatures, on the order of −196° C., e.g., liquid nitrogen temperatures, it must have an expansion coefficient closely matched to the sensor array material which is silicon. Otherwise the lens array cannot maintain registration with the sensor array at various temperatures. The last requirement practically dictates that the lens array also be made of silicon.

Heretofore lens arrays in silicon have been attempted to be made by cutting, as with a diamond tool. However, since a typical sensor array is an array of 32×64 infrared sensor elements and up to 68×128 elements, it is obvious that the lens array periodicity must be accurate to within ±0.1% across the silicon chip to maintain accurate registration between the individual lenses and the individual sensors or detectors. Thus the problems of manufacture are far from trivial.

SUMMARY OF THE INVENTION

The process of the present invention comprises a series of steps whereby a uniform grating having the periodicity required for the lens array is employed as a mask for a 100 silicon wafer. A series of deep V-grooves is anisotropically etched into the wafer using standard photolithographic techniques. A polishing etch is next used to etch a cylindrical lens profile for each groove in the silicon.

DETAILED DESCRIPTION OF THE INVENTION

A 100 silicon wafer, in which deep V-grooves are to be etched, is chosen so as to have a wafer flat corresponding to the 110 direction with a deviation of less than 0.5°. The silicon wafer can be of low dopant concentration, either n-type or p-type, free of dislocations. Such high-quality silicon wafers are readily available for the semiconductor industry.

The silicon wafers are coated first with a protective coating of silicon dioxide, conveniently about 2,000 Å thick. This coating can be applied by sputtering, but more conveniently is grown by thermal oxidation of the wafer in steam at about 950°–975° C., preferably in the presence of chloride, to minimize crystallographic damage to the wafer. This process is well known in the semiconductor industry and is described, for example, in U.S. Pat. No. Re. 28,385 to Mayer.

Figure 1:
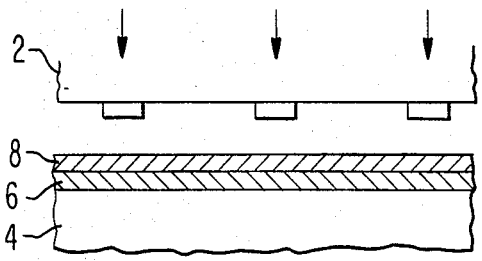
FIGS. 1–6 illustrate the series of steps used to form regular and exact lenticular arrays in silicon according to the invention.

The wafer is next coated with a conventional positive photoresist such as Shipley 1350 photoresist. The photoresist can be applied from solution as by spinning or dipping the wafer. The wafer is then exposed through a photomask having a uniform grating structure of the periodicity required for the lens array. The space-to-line ratio (aspect ratio) of the grating is determined by the focal length of the lens array desired and is, in general, from about 1:10 to 1:2. The periodicity of the photomask grating determines the periodicity of the lens array. The photomask must be of high quality, free of cosmetic and other defects, since this quality will be reflected in the quality of the lens array mask. Further, the photomask grating must be parallel to the wafer flat to ensure that the grating structure in the wafer is aligned as closely as possible with the 110 crystallographic direction of the silicon substrate. The above arrangement is illustrated in FIG. 1 wherein a photomask grating 2 is placed over a silicon wafer 4 overcoated with a silicon dioxide layer 6 and a photoresist layer 8. After exposure, the photoresist layer 8 is developed in accordance with standard techniques, transferring the grating onto the surface of the wafer.

Figure 2:
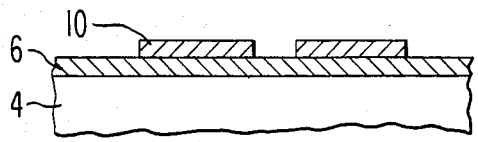

The silicon wafer 4, having the patterned photoresist layer 10 thereon is shown in FIG. 2 and is preferably given a post-bake to harden the photoresist layer 10.

Figure 3:
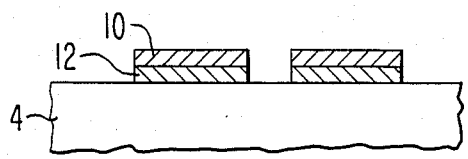

The silicon wafer 4 is then etched to remove the silicon oxide 6 in those areas not protected by photoresist. The patterned silicon oxide layer is shown as layer 12. Either wet etching using a buffered HF solution, or dry etching using sputtering or reactive plasma etching techniques, can be employed. Dry etching is preferred since it avoids undercutting of the photoresist layer. This ensures accurate transfer of the photomask pattern into the masking oxide layer. This step is shown in FIG. 3.

Figure 4:
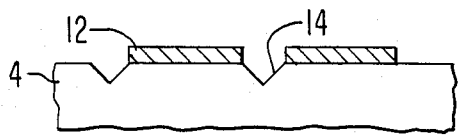

The remaining photoresist is then stripped away and the exposed silicon is anisotropically etched so as to form a series of deep V-grooves 14 in the surface of the silicon wafer 4, as shown in FIG. 4.

An anisotropic silicon etch is employed that will etch silicon much faster in the 100 direction as compared to the 111 direction, and be inert with respect to the masking silicon oxide layer. For example, a preferred etchant is made from 17 parts by volume of ethylene diamine, 3 parts by weight of pyrocatechol and 8 parts of water, suitably at about 100° C. Another etchant can be made from 20 parts by weight of KOH in 90 parts of water and 20 parts by volume of isopropanol. This latter etchant does attack silicon oxide however and can only be employed if the silicon is etched sufficiently before the silicon oxide layer etches away also. These etchant solutions will etch silicon from 50 to 100 times faster in the 100 plane than in the 111 plane. Since the grating has been aligned with the 110 crystal direction, the walls of the V-groove are defined by two 111 crystal planes, and the etching is essentially self-limiting with the formation of the V-groove. The bottom of the groove will be extremely sharp since it corresponds to the intersection of two 111 crystal planes. This significantly minimizes the area between lenses of the completed array and ensures a minimum of stray light from the array.

Figure 5:
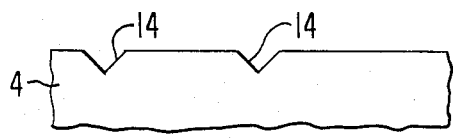

The protective silicon oxide layer 12 is next removed with an HF solution or other suitable etchant, and the wafers are cleaned in conventional manner. The cleaned, etched silicon wafer 4 having V-grooves 14 therein is shown in FIG. 5. The V-groove becomes the cusp between each lenslet to be made.

Figure 6:

A silicon polishing etch is next employed to etch the silicon shoulders between each V-groove to form a cylindrical profile. A suitable etchant is a mixture of HF, acetic acid, and nitric in volume proportions of 3:3:5. This etchant can be employed in other proportions, as is known, depending upon the speed of etching desired. The above etchant requires about 15–20 minutes to obtain a profile desired for the present application. The solution can be vibrated during etching to prevent any gas bubbles from sticking to the silicon surface, causing defects. During the etching approximately 100 microns of the original wafer thickness is removed. As the wafer thins down, the sharp V-groove persists while the rest of the surface etches away to a cylindrical profile. Using an original photomask with an aspect ratio of 2:1, having a 55 micron V-groove width, lens arrays having a periodicity of 160 microns and varying in lens profiles from 24 micron lens height to 32 micron lens height, depending on the time of etching, can be made. Other etchant solutions will vary both the profile of the lens and the depth of the lens, with the depth of the lens depending on the time of etching. This final step is illustrated in FIG. 6.

Figure 7A:
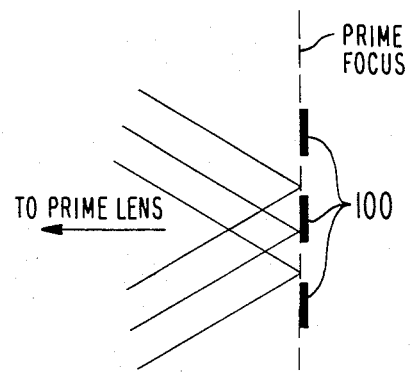
FIGS. 7a and 7b illustrate a detector element without and with, respectively, a lenticular array.
Figure 7B:
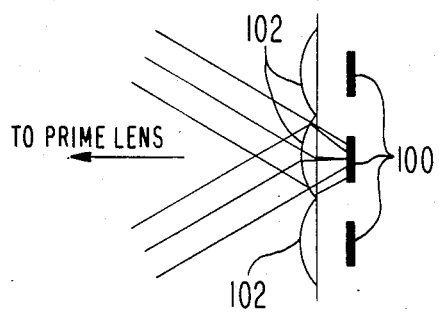
Figure 8:
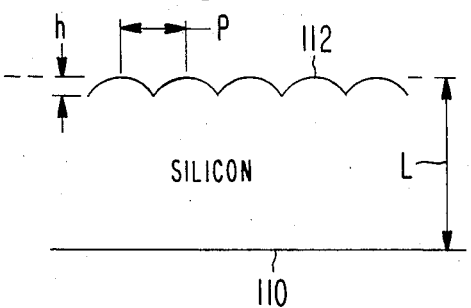
FIG. 8 shows a lenticular array in silicon.

FIGS. 7a and 7b illustrate how the present lens arrays will be employed. FIG. 7a, without the lens array, shows that only a portion of the light from the prime lens is directed to the detectors 100. FIG. 7b shows the prime lens light being corrected by a lenslet 102 which directs the light onto the detector 100. For a prime lens F/217, and a 32×64 Schottky charge-coupled device array on a silicon chip 380 microns thick, a suitable lenticular silicon array will be about 150 microns thick, have a lens periodicity about 160 microns across, and a vertical lens height of about 10 microns. This lens array is shown in FIG. 8, where L is the lenticular array thickness, P is the lens periodicity, and h is the lens height.

To complete the silicon lens array, the back surface 110 is polished and both surfaces 110 and 112 are coated with a 5,000 Å thick silicon oxide antireflection coating. Silicon monoxide is presently preferred because of its refractive index characteristics, although silicon dioxide may also be suitable.

The above processing steps can be carried out as an integral part of the manufacture of a lens array, by completing the lens array on the back of a silicon wafer while making the sensor array on the opposite side of the same silicon wafer.

I claim:

1. A process for manufacturing lens arrays in silicon which comprises:
   (a) coating a 100 silicon wafer with a first protective layer of silicon oxide and a layer of photoresist over the oxide layer,
   (b) exposing the photoresist through a photomask having a uniform grating of the desired periodicity of the lens array,
   (c) developing the photoresist and etching through the oxide layer to form a regular series of openings to the silicon substrate,
   (d) anisotropically etching the silicon substrate to form a series of V-grooves in the openings wherein the walls of the grooves intersect along the 111 planes,
   (e) removing the photoresist and oxide layers, and
   (f) exposing the silicon substrate to a polishing etch bath to alter the profile of the silicon substrate to form a series of regularly shaped lenses between the V-grooves but without altering the sharpness of the bottom of said V-groove.

2. A process according to claim 1 wherein the anisotropic etchant is a solution of potassium hydroxide and isopropanol in water.

3. A process according to claim 1 wherein the anisotropic etchant is a solution of ethylene diamine and pyrocatechol in water.

4. A process according to claim 1 wherein the polishing etchant is a solution of hydrofluoric acid, acetic acid, and nitric acid.

5. A process according to claim 1 wherein the photomask grating is parallel to the wafer flat and aligned with the 110 crystallographic plane of the silicon wafer.

6. A process according to claim 1 wherein a charge-coupled infrared sensor array is formed on the opposite side of the silicon wafer.

7. A process according to claim 1 wherein the silicon lens arrays are coated with a silicon oxide antireflection coating.

8. A process according to claim 5 wherein the silicon oxide is silicon monoxide.

* * * * *